(12) United States Patent
Lu et al.

(10) Patent No.: US 6,630,394 B2
(45) Date of Patent: Oct. 7, 2003

(54) SYSTEM FOR REDUCING SILICON-CONSUMPTION THROUGH SELECTIVE DEPOSITION

(75) Inventors: Jiong-Ping Lu, Richardson, TX (US); Jin Zhao, Plano, TX (US); Yuqing Xu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/131,162

(22) Filed: Apr. 24, 2002

(65) Prior Publication Data

US 2003/0124808 A1 Jul. 3, 2003

Related U.S. Application Data

(60) Provisional application No. 60/344,668, filed on Dec. 28, 2001.

(51) Int. Cl.[7] .................. H01L 21/336; H01L 21/8234; H01L 21/4763; H01L 21/44
(52) U.S. Cl. .................. 438/592; 438/197; 438/585; 438/655; 438/683
(58) Field of Search ................. 438/197, 585, 438/592, 655, 682, 683

(56) References Cited

U.S. PATENT DOCUMENTS

| | | | | |
|---|---|---|---|---|
| 4,389,257 A | * | 6/1983 | Geipel, Jr. et al. |
| 4,492,971 A | * | 1/1985 | Bean et al. |
| 5,818,092 A | * | 10/1998 | Bai et al. |
| 6,169,005 B1 | * | 1/2001 | Kepler et al. |
| 6,238,986 B1 | * | 5/2001 | Kepler et al. |

FOREIGN PATENT DOCUMENTS

| | | | |
|---|---|---|---|
| EP | 0689237 A | * | 12/1995 |
| JP | 405067584 A | * | 3/1993 |

* cited by examiner

*Primary Examiner*—John F. Niebling
*Assistant Examiner*—Ron Pompey
(74) *Attorney, Agent, or Firm*—Yingsheng Tung; Wade James Brady, III; Frederick J. Telecky, Jr.

(57) ABSTRACT

Disclosed is a system for fabricating a semiconductor device (100). A layer of cobalt (32) is deposited onto a silicon region (104, 106, 108) and annealed to form a cobalt silicide layer (118, 120, 122). Silicon layers (124, 126, 128) are selectively deposited onto the cobalt silicide layers (118, 120, 122). The semiconductor device (100) is annealed to form disilicide layers (130, 132, 134) from the cobalt silicide layers (118, 120, 122) and the silicon contained in silicon regions (104, 106, 108) and silicon layers (124, 126, 128).

17 Claims, 2 Drawing Sheets

SYSTEM FOR REDUCING SILICON-CONSUMPTION THROUGH SELECTIVE DEPOSITION

This application claims priority from Provisional Application Serial No. 60/344,668, filed on Dec. 28, 2001.

FIELD OF THE INVENTION

The present invention relates to semiconductor device fabrication, and more specifically, to a system for forming a disilicide region to reduce consumption of underlying silicon.

BACKGROUND OF THE INVENTION

Since the invention of integrated circuits, the number of devices on a chip has grown at a near-exponential rate. The fabrication methods of the semiconductor industry have been modified and improved continuously for almost four decades. With each improved method, the capacity of a single semiconductor chip has increased from several thousand devices to hundreds of million devices. Future improvements will require integrated circuit devices such as transistors, capacitors, and connections between devices to become even smaller and more densely populated on the chip.

The increased packing density of the integrated circuit generates numerous challenges to the semiconductor manufacturing process. Every device must be smaller without damaging the operating characteristics of the integrated circuit devices. The requirements of high packing density, low heat generation, and low power consumption devices with good reliability and long operation life must be maintained without any functional degradation. Increased packing density of the integrated circuits is usually accompanied by smaller feature size.

Transistors, or more particularly, metal oxide semiconductor field effect transistors (MOSFET), are important and frequently employed devices. The MOSFET is commonly used in integrated circuits because of its desirable performance characteristics. However, sub-micron scale MOSET's are prone to problems such as junction punchthrough, current leakage, and contact resistance, which cause reduced yield and reliability. Further, connections between such transistors must also have smaller dimensions, or similar problems may occur throughout the circuit.

Semiconductor device fabrication often uses a self-aligned silicidation process (SALICIDE). In a silicidation process, a metal (e.g., titanium) is placed into contact with silicon and heated. Heating of the metal and silicon causes the two to combine to form a silicide compound. Silicidation is conventionally used to provide a conductive contact between silicon in a semiconductor device and a metal contact, which may be connected to a conductive lead. The resulting silicon-silicide-metal combination provides lower contact resistance than a direct metal-to-silicon contact. Large contact resistance is generally detrimental to the performance of a semiconductor device.

A problem with the use of titanium as the metal in a silicide compound is that titanium silicide suffers from various size effects. As the volume of a titanium silicide region in a semiconductor device decreases, its contact resistance increases. Thus, as semiconductor devices shrink, particularly the length of a gate in a semiconductor device, the use of titanium silicide has become unacceptable due to resulting high contact resistances. Because of the susceptibility to size effects of titanium silicide, cobalt and nickel are sometimes used as alternatives. In contrast to titanium silicide, cobalt silicide and nickel silicide do not suffer size effects and have a relatively constant resistance for varying volumes of the resulting silicide compound.

Titanium silicide, although widely used in 0.25 um and above device applications, is not suitable for fabricating sub-0.25 um devices. Nickel silicide is desirable for sub-0.25 um devices because it is independent of line width. Nickel silicide, however, is the least stable silicide. Cobalt silicide is independent of line width and is stable for the thermal budget used in most devices. Cobalt silicide formation does, however, consume the most silicon of all the silicides. This consumption limits the use of cobalt silicide as junctions become shallower because of increased packing density.

A conventional salicide fabrication process is depicted in FIGS. 1A–1E. A semiconductor device 10 is formed on silicon substrate 12. FIG. 1A depicts semiconductor device 10 during an initial state of construction after formation of a source region 14 and a drain region 16 in a substrate 12 and after formation of a gate body 18 overlying an oxide layer 20. Also depicted in FIG. 1A are thick field oxide regions 22 used to isolate the resulting semiconductor device 10 from adjacent semiconductor devices. Source region 14, drain region 16, gate body 18, oxide layer 20, and field oxide regions 22 may be formed according to conventional techniques.

One example of a conventional technique for forming the semiconductor device 10 depicted in FIG. 1A is described below. In this example, substrate 12 is a P-type silicon substrate; however, substrate 12 could be an N-type substrate. Thick field oxide regions 22 are formed by local oxidation of silicon using a process such as that shown in Havemann, et al. U.S. Pat. No. 4,541,167, issued Sep. 17, 1985 and assigned to the assignee of this application. Substrate 12 is then subjected to a thermal oxidation in a steam environment for approximately 7 minutes at a temperature of approximately 850° C. to form oxide layer 20 as shown in FIG. 1A. Oxide layer 20 may be grown to a thickness of approximately 3 to 10 nanometers, however, other thicknesses for oxide layer 20 may be used. A polysilicon layer is then deposited, patterned and etched using conventional photolithographic techniques to form polysilicon gate body 18. A thickness of polysilicon gate body is approximately 400 nanometers. Appropriate ions 19 are then implanted, self-aligned aligned to form source region 14 and drain region 16. For a P-type substrate, appropriate ions include phosphorous ions and arsenic ions. A typical implantation includes implantation of arsenic ions at a density of approximately $3 \times 10^5$ ions per square centimeter and an energy of approximately 150 kiloelectron volts. A second ion implantation of phosphorous ions having a density of approximately $4 \times 10^{14}$ ions per square centimeter and an energy level of approximately 85 kiloelectron volts may also be incorporated.

A channel region is defined within substrate 12 between source region 14 and drain region 16. Although particular details of the formation of source region 14, drain region 16, gate body 18, oxide layer 20, and field oxide regions 22 have been provided, other methods and techniques are used.

FIG. 1B depicts semiconductor device 10 after formation of a gate oxide layer 24 and sidewall spacers 26 and 28. Gate oxide layer 24 is formed by patterning and etching oxide layer 20 using conventional photolithographic techniques. Sidewall spacers 26 and 28 provide separation between a silicide that will be formed over source and drain regions 14, 16 and gate body 18, which is electrically conductive. Sidewall spacers 26 and 28 may be formed, for example, by depositing a conformal layer of TEOS oxide over semiconductor device 10 and anisotropically etching the TEOS oxide layer, which leaves sidewall spacers 26 and 28. Sidewall spacers 26 and 28 may alternatively be formed prior to implantation of ions 19 to form source region 14 and drain region 16.

FIG. 1C depicts the deposition of a thin buffer layer 30 of metal. Thin buffer layer 30 acts as a buffer layer between silicon in source region 12, drain region 14, and gate body 18 and a metal layer during formation of silicide regions in semiconductor device 10. Zirconium and hafnium are both particularly suitable metals for thin buffer layer 30; however, other suitable metals are used. Thin buffer layer 30 is deposited outwardly from semiconductor device 10 to a thickness of approximately 1 to 5 nanometers. Thin buffer layer 30 resists spiking during the formation of a silicide and also contributes to low contact resistance between a resulting silicide and a metal contact. Although particular thicknesses for thin buffer layer 30 have been described, other thicknesses for thin buffer layer 30 are used.

A metal layer 32 is depicted disposed over thin buffer layer 30. Metal layer 32 is provided for reaction with silicon in source region 14, drain region 16, and gate body 18 to produce silicide regions for establishing an electrical connection with metal contacts. These silicide regions provide lower contact resistance between a metal contact and the silicon in source region 14, drain region 16, or gate body 18 than would occur with a direct contact between a metal contact and the silicon in source region 14, drain region 16, or gate body 18. Metal layer 32 may be formed from any suitable metal that is a different metal from that used for thin buffer layer 30; however, cobalt and nickel are both particularly advantageous metals for use in metal layer 32. Both cobalt silicide and nickel. silicide do not suffer size effects traditionally associated with the use of titanium to form a silicide compound. Therefore, the use of such materials allows for reduced contact resistances, which are particularly important as the size of semiconductor devices decrease. Nickel silicide, however, is the least stable silicide. Cobalt silicide, as mentioned above, consumes the most silicon during silicide formation.

FIG. 1D depicts semiconductor device 10 after reaction of metal layer 32 with thin buffer layer 30 and the silicon in source region 14, drain region 16, and gate body 18. The reaction of these materials forms a silicide region 34 over source region 14, a silicide region 36 over drain region 16, and a silicide region 38 over gate body 18. Silicide regions 34, 36, and 38 are formed by heating or annealing the semiconductor device 10 such that the metal in metal layer 32 reacts with the silicon in source region 14, drain region 16, and gate body 18, as well as the metal in thin buffer layer 30 to form a silicide. In addition to this anneal, a second anneal may be performed with similar temperature and time conditions to cause further reaction of the materials. A second anneal, however, will consume an additional amount of silicon from gate body 18.

Because different metals are used within metal layer 32 and thin buffer layer 30, a silicide compound is formed within silicide regions 34, 36, and 38 incorporating each metal. With thin buffer layer 30 being thinner than metal layer 32, the metal in metal layer 32 will form a majority silicide within silicide regions 34, 36, and 38 and the metal within thin buffer layer 30 will form a minority silicide within silicide regions 34, 36, and 38.

FIG. 1E depicts semiconductor device 10 after additional processing steps associated with removing thin buffer layer 30 and metal layer 32. After formation of silicide regions 34, 36, and 38, the unreacted metals in metal layer 32 and thin buffer layer 30 may be selectively removed through the use of an etchant that does not attack the silicide in silicide regions 34, 36, and 38, silicon substrate 12, or field oxide regions 22. An example of such an etchant is a mixture of $H_2O_2$ and $H_2SO_4$.

SUMMARY OF THE INVENTION

Therefore, a system for forming disilicide layers that does not consume excessive silicon from source, drain or gate regions of a semiconductor device, is now needed, providing for fabrication of smaller and more reliable semiconductor devices while overcoming the aforementioned limitations of conventional methods.

The present invention provides a system for fabricating a semiconductor device. A layer of cobalt is deposited onto a silicon region and annealed to form a cobalt silicide layer. Silicon layers are selectively deposited onto the cobalt silicide layers. The semiconductor device is annealed to form disilicide layers from the cobalt silicide layers and the silicon contained in silicon regions and silicon layers.

BRIEF DESCRIPTION OF THE DRAWINGS

For a more complete understanding of the present invention, including its features and advantages, reference is made to the following detailed description, taken in conjunction with the accompanying drawings. Corresponding numerals and symbols in the different figures refer to corresponding parts unless otherwise indicated.

DETAILED DESCRIPTION OF THE INVENTION

It should be understood that the principles and applications disclosed herein may be applied to a wide range of semiconductor device fabrication processes. For purposes of explanation and illustration, the present invention is hereafter described in reference to several specific instances of semiconductor device fabrication. The present invention, however, is equally applicable in any number of fabrication processes that might benefit from the present invention.

Figure 1A:
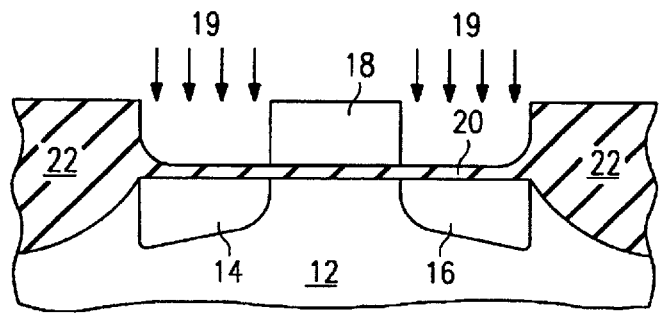
FIGS. 1A–1E depict a prior art salicide process.
Figure 1B:
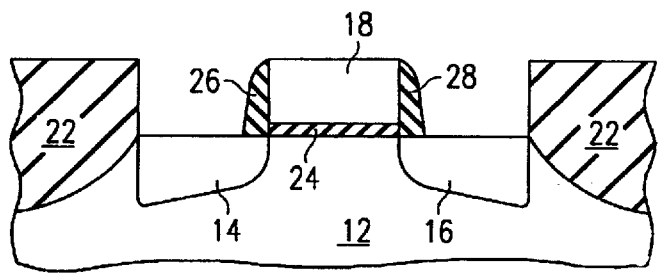
Figure 1C:
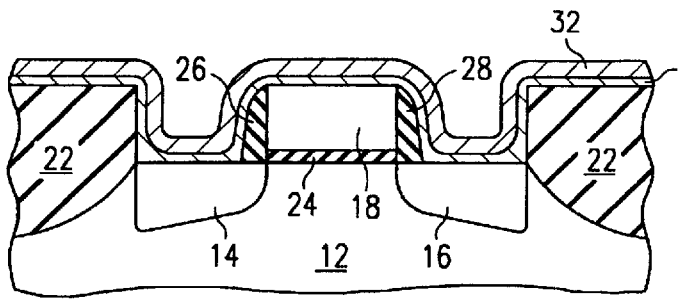
Figure 1D:
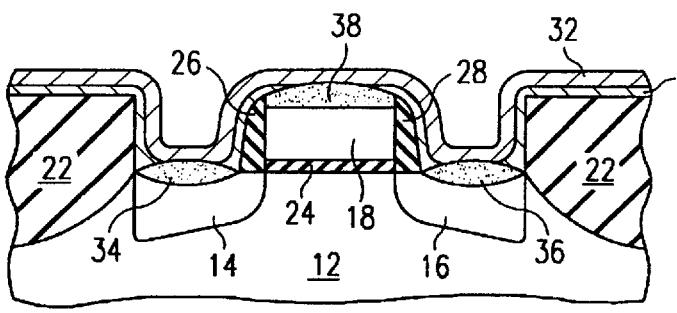
Figure 1E:
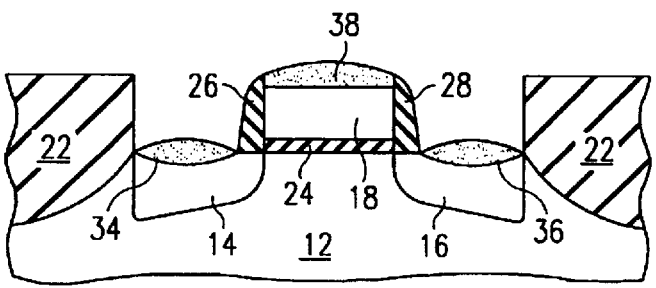
Figure 2A:
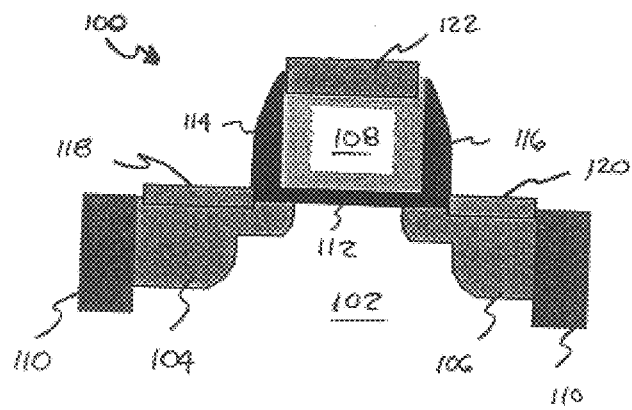
FIGS. 2A–2C depict an embodiment of a salicide process in accordance with the present invention.
Figure 2B:
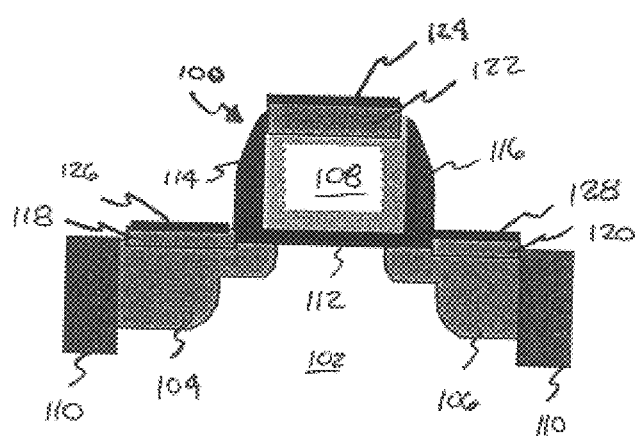
Figure 2C:
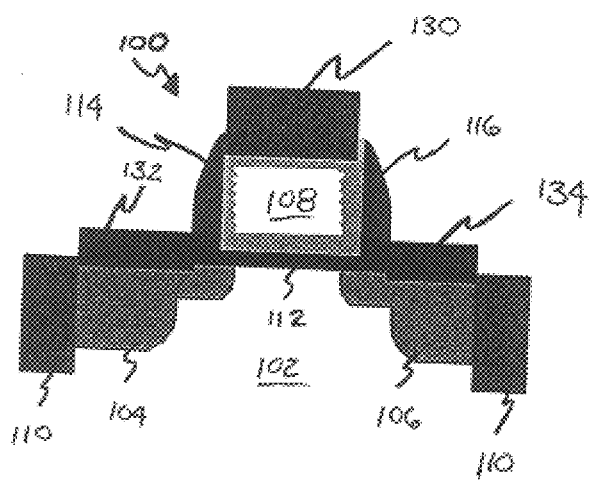

Turning now to the present invention as depicted in FIGS. 2A–2C, semiconductor device 100 is formed in general accordance with conventional procedures as described in reference to FIGS. 1A–1E. The semiconductor device 100 is formed on silicon substrate 102. FIG. 2A depicts semiconductor device 100 during an initial state of construction after formation of a source region 104 and a drain region 106 in a substrate 102 and after formation of a gate body 108 overlying a gate oxide layer 112. Also depicted in FIG. 2A are thick field oxide regions 110 used to isolate the resulting semiconductor device 100 from adjacent semiconductor devices. Source region 104, drain region 106, gate body 108, field oxide regions 110 and sidewall spacers 114 and 116 may be formed according to conventional techniques.

A metal layer (not shown), which may be a cobalt layer, is deposited over the semiconductor device 100. The cobalt layer is deposited to a thickness in the range of 4 nanometers to 40 nanometers; however, other thicknesses may be deposited. FIG. 2A depicts semiconductor device 100 after reaction of cobalt layer with the silicon in source region 104, drain region 106 and gate body 108. The reaction of cobalt and silicon forms a cobalt silicide (CoSi) region 118 over source region 104, a cobalt silicide region 120 over drain region 106, and a cobalt silicide region 122 over gate body 108. Cobalt silicide regions 118, 120, and 122 are formed by heating or annealing semiconductor device 100 such that the cobalt in cobalt layer reacts with the silicon in source region 104, drain region 106, and gate body 108, to form a silicide. Annealing may be accomplished by heating to a temperature in the range of 450° C. to 600° C. for a time period of 10 seconds to 100 seconds.

Turning now to FIG. 2B, silicon may be selectively deposited over cobalt silicide regions 118, 120, and 122. Silicon may be selectively deposited on cobalt silicide regions 118, 120, and 122 by exposing semiconductor device 100 to thermal decomposition of $SiH_4$ at a temperature in the range of 300–500° C. for between 60 and 360 seconds. As $SiH_4$ decomposes, Si and $H_2$ are formed. As a result, silicon layer 124 is deposited on cobalt silicide region 122, silicon layer 126 is deposited on cobalt silicide region 118, and silicon layer 128 is deposited on cobalt silicide region 120. A precise amount of silicon may be deposited for the formation of $CoSi_2$ in a subsequent anneal. Alternatively, excess silicon may be deposited and unreacted silicon may be removed after $CoSi_2$ is formed.

Turning now to FIG. 2C, semiconductor device 100 is subjected to a second anneal. Semiconductor device 100 may be annealed at a temperature in the range of 600–900° C. for 10 seconds to 100 seconds, preferably for about 30 seconds. This anneal causes the cobalt silicide regions 118, 120, and 122 to react with the silicon in the source region 104, drain region 106, and gate body 108 and also with the selectively deposited silicon layers 124, 126 and 128. As a result, a disilicide ($CoSi_2$) layer 130 is created over gate body 108, a disilicide layer 132 is created over source region 104, and a disilicide layer 134 is created over drain region 106. Because silicon layers 124, 126 and 128 provide silicon to the reaction to create disilicide layers 130, 132, and 134, less silicon is consumed from source region 104, drain region 106, and gate body 108. Consuming silicon from silicon layers 124, 126, and 128, rather than from source region 104, drain region 106, and gate body 108, is advantageous as source region 104, drain region 106, and gate body 108 become shallower in smaller semiconductor devices. For example, all of the silicon in a shallow source region 104, drain region 106, and gate body 108 may be consumed during disilicide formation if silicon layers 124, 126 and 128 are not present. This undesirable condition is known as punchthrough. Silicon layers 124, 126, and 128 provide sacrificial sources of silicon for disilicide formation, which may reduce or eliminate punchthrough during fabrication of the semiconductor device 100.

Although this invention has been described with reference to illustrative embodiments, this description is not intended to be construed in a limiting sense. Upon reference to the description, it will be apparent to persons skilled in the art that various modifications and combinations of the illustrative embodiments as well as other embodiments of the invention can be made without departing from the spirit and scope of the invention. It is therefore intended that the appended claims encompass any such modifications or embodiments.

What is claimed is:

1. A method of fabricating a semiconductor device, comprising the steps of:
   depositing Co onto a first Si layer to form a Co layer;
   thermal treating the above system to form a Co silicide layer;
   removing an un-reacted portion of Co layer;
   selectively depositing a second Si layer onto the Co silicide layer; and
   annealing the Co silicide layer and the first and second silicon layers to form a cobalt disilicide layer.

2. The method of claim 1 wherein the first Si layer comprises a gate region of a transistor.

3. The method of claim 1 wherein the first Si layer comprises a source region of a transistor.

4. The method of claim 1 wherein the first Si layer comprises a drain region of a transistor.

5. The method of claim 1 wherein the step of selectively depositing the second Si layer comprises deposition by chemical vapor deposition.

6. The method of claim 1 wherein the step of selectively depositing the second Si layer is performed at a temperature of in the range of 300–500° C.

7. The method of claim 1 wherein the step of annealing the Co silicide layer and the first and second Si layers comprises annealing between about 600° C. and about 900° C.

8. A method of forming a semiconductor device comprising the steps of:
   forming a gate on a substrate;
   depositing a metal layer over the gate;
   forming a self-aligning silicide and removing the residual metal;
   selectively depositing silicon over the silicide layer; and
   annealing the silicide on the gate.

9. The method of claim 8, wherein the step of depositing a metal layer over the gate comprises depositing a metal layer comprising cobalt.

10. The method of claim 8, wherein the step of annealing comprises annealing at a temperature in the range of 600 degrees Centigrade to 900 degrees Centigrade.

11. The method of claim 10, wherein the step of annealing comprises annealing for a time period in the range of 10 seconds to 100 seconds.

12. The method of claim 8, wherein the step of depositing a metal layer further comprises depositing a metal layer having a thickness in the range of 4 to 40 nanometers.

13. A method of forming a semiconductor device in the surface of a substrate, the method comprising the steps of:

separating a semiconductor gate body from the outer surface of the substrate by a gate insulator layer;

forming a conductive drain region in the outer surface of the substrate and spaced apart from the gate body;

forming a conductive source region in the outer surface of the substrate and spaced apart from the gate body opposite the conductive drain region to define a channel region in the substrate disposed inwardly from the gate body and the gate insulator layer;

depositing a metal layer over the gate body, the conductive source region, and the conductive drain region;

reacting the metal layer with the gate body, the conductive source region, and conductive drain region to form respective first, second and third silicide regions;

selectively removing unreacted metal layer from non-conductive regions;

selectively depositing silicon over the first, second and third silicide regions; and reacting the silicon with the first, second and third silicide regions to form respective first, second and third disilicide regions.

14. The method of claim 13, wherein the step of depositing a metal layer over the gate body, the conductive source region, and the conductive drain region comprises depositing cobalt.

15. The method of claim 13, wherein the step of reacting the silicon with the first, second and third silicide regions comprises annealing the silicon and the first, second and third silicide regions.

16. The method of claim 15, wherein the step of annealing comprises annealing at a temperature in the range of 650 degrees Centigrade to 850 degrees Centigrade for a time period in the range of 10 seconds to 100 seconds.

17. The method of claim 13, wherein the step of depositing a metal layer further comprises depositing a metal layer having a thickness in the range of 4 to 40 nanometers.

* * * * *